(12) United States Patent
Qiao

(10) Patent No.: US 7,183,222 B2
(45) Date of Patent: Feb. 27, 2007

(54) DUAL DAMASCENE STRUCTURE AND METHOD OF MAKING

(75) Inventor: Jianmin Qiao, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 91 days.

(21) Appl. No.: 10/765,072

(22) Filed: Jan. 28, 2004

(65) Prior Publication Data

US 2004/0183199 A1 Sep. 23, 2004

Related U.S. Application Data

(62) Division of application No. 09/654,078, filed on Sep. 1, 2000, now abandoned.

(51) Int. Cl.
*H01L 21/00* (2006.01)

(52) U.S. Cl. .................. 438/723; 438/738; 438/740; 438/700

(58) Field of Classification Search ............ 438/700, 438/723, 738, 740
See application file for complete search history.

(56) References Cited

U.S. PATENT DOCUMENTS

| | | | |
|---|---|---|---|
| 6,130,102 A | 10/2000 | White, Jr. et al. | |
| 6,245,669 B1 | 6/2001 | Fu et al. | |
| 6,313,025 B1 | 11/2001 | Chittipeddi et al. | |
| 6,322,716 B1 * | 11/2001 | Qiao et al. | 216/67 |
| 6,350,665 B1 * | 2/2002 | Jin et al. | 438/585 |
| 6,372,634 B1 * | 4/2002 | Qiao et al. | 438/637 |
| 6,399,512 B1 * | 6/2002 | Blosse et al. | 438/723 |
| 6,602,434 B1 * | 8/2003 | Hung et al. | 216/39 |
| 6,635,566 B1 * | 10/2003 | Blosse et al. | 438/638 |
| 6,693,042 B1 * | 2/2004 | Sedigh et al. | 438/714 |
| 6,734,108 B1 * | 5/2004 | Jin et al. | 438/700 |
| 6,803,318 B1 * | 10/2004 | Qiao et al. | 438/700 |
| 6,849,193 B2 * | 2/2005 | Hung et al. | 216/67 |

* cited by examiner

*Primary Examiner*—Laura M. Schillinger
(74) *Attorney, Agent, or Firm*—Oblon, Spivak, McClelland, Maier & Neustadt, P.C.

(57) ABSTRACT

A dual damascene interconnect structure, produced using etch chemistry based on $C_2H_2F_4$, includes (i) an etch stop layer of either undoped silicon oxide or doped silicon oxide, and (ii) dielectric layers both above and below the etch stop layer of the other (i.e., when the etch stop layer comprises undoped silicon oxide, the dielectric layers above and below the etch stop layer independently comprise a doped silicon oxide; and when the etch stop layer comprises doped silicon oxide, the dielectric layers above and below the etch stop layer independently comprise an undoped silicon oxide).

4 Claims, 3 Drawing Sheets

DUAL DAMASCENE STRUCTURE AND METHOD OF MAKING

BACKGROUND OF THE INVENTION

1. Field of the Invention

This invention relates to electrical connections in integrated semiconductor circuits. In particular, this invention relates to a dual damascene interconnect structure and to methods of making the interconnect structure.

2. Discussion of the Background

To form integrated circuits, discrete semiconductor devices must be wired together electrically. The electrical wiring used frequently includes damascene structures. Damascene structures are produced by forming grooves in an insulating layer and then filling the grooves with metal. Advances in damascene processing have led to processes characterized as dual damascene.

Dual damascene is a multi-level interconnection process in which, in addition to forming the grooves of single damascene, via openings (i.e., contact holes) are also formed. In one dual damascene process, an insulating layer is coated with a photoresist, which is exposed through a first mask with image pattern of the via openings. The pattern is anisotropically etched in the upper half of the insulating layer. The photoresist is then exposed through a second mask with an image pattern of conductive line openings, after being aligned with the first mask pattern to encompass the via openings. In anisotropically etching the openings for the conductive lines in the upper half of the insulating material, the via openings already present in the upper half are simultaneously etched and replicated in the lower half of the insulating material. After the etching is complete, both the vias and line openings are filled with metal. Dual damascene is an improvement over single damascene because it permits the filling of both the conductive grooves and vias with metal at the same time, thereby eliminating process steps.

A number of dual damascene processes have been developed, including processes using an insulating layer that includes an etch stop layer. In an example of such a process, a first layer of insulator is deposited over a first level of patterned metal to which electrical contacts are to be selectively established. The first layer is planarized, if the underlying structure is not formed using a damascene process, and then covered by an etch stop material. Contact holes are defined in the etch stop material by a first lithography at locations where vias are required. The first insulator layer is not etched at this time. A second insulator layer, having a thickness equal to the thickness of the second level of patterned metal of the multi-level structure being formed, is deposited over the etch stop material. The second insulator layer, in turn, is etched by a second photolithography down to the etch stop material to define desired wiring channels, some of which will be in alignment with the previously formed via holes in the etch stop material. In those locations where the via holes are exposed, the etching is continued into the first insulator layer to uncover the underlying first level of patterned metal. The horizontal channels and vertical holes etched into the second and first insulator layers are next overfilled with metal. As a final step, excess metal on top of the second insulator layer but not in the channels or holes is removed by etching or chemical-mechanical polishing.

In another example of a dual damascene process using an etch stop layer, a first layer of insulator is deposited over a first level of patterned metal to which electrical contacts are to be selectively formed. The first layer is planarized, if the prior structure is not formed using a damascene process, and then covered by an etch stop material. A second insulator layer, having a thickness equal to the thickness of the second level of patterned metal of the multi-level structure being formed, is deposited over the etch stop material. Contact holes are then defined on top of the second insulator layer by a first lithography at locations where vias are to be formed. The second insulator layer, the etch stop layer and the first insulator layer are etched at this time to form the via holes. A second photolithography is performed on the second insulator material to define desired wiring channels, some of which will be in alignment with the previously formed via holes. A second plasma etch process, requiring an etch selectivity between the second insulator material and the etch stop material, is used to form horizontal channels in the second insulator layer. The horizontal channels and the vertical via holes are next overfilled with metal. As a final step, excess metal on top of the second insulator layer but not in the channels or holes is removed by etching or chemical-mechanical polishing.

In still another example of a dual damascene process using an etch stop layer, a first layer of insulator is deposited over a first level of patterned metal to which electrical contacts are to be selectively formed. The first layer is planarized, if the underlying structure is not formed using a damascene process, and then covered by an etch stop material. A second insulator layer, having a thickness equal to the thickness of the second level of patterned metal of the multi-level structure being formed, is deposited over the etch stop material. Horizontal channels are then defined on top of the second insulator layer by a first lithography at locations where metal conducting trenches are required. The second insulator layer is etched at this time, either selectively stopping at the etch stop layer or being timely controlled to reach the required trench depth. A second photolithography is performed on the second insulator material to define via openings, some of which will be in alignment with the previously formed channels. A second plasma etch process is performed to open the via holes. The horizontal channels in the second insulator layer and the vertical via holes are next overfilled with metal. As a final step, excess metal on top of the second insulator layer but not in the channels or holes is removed by etching or chemical-mechanical polishing. In conventional dual damascene processes, the etch stop layer used is typically silicon nitride.

Huang et al. U.S. Pat. No. 5,635,423 reports a modified dual damascene process in which an initial opening in a trench dielectric is enlarged while simultaneously extending a via opening through an etch stop layer and a via dielectric.

Avanzino et al. U.S. Pat. No. 5,795,823 reports the fabrication of conductive lines and connecting vias using dual damascene with only one mask pattern. This is also reported by Avanzino et al. in U.S. Pat. No. 5,614,765.

Yen U.S. Pat. No. 5,861,676, reports a method of forming interconnects and contacts between elements in a semiconductor or integrated circuit.

Dai et al U.S. Pat. No. 5,877,075 reports forming dual damascene patterns using a single photoresist process.

Dai U.S. Pat. No. 5,877,076 reports a dual damascene process using opposite type two-layered photoresist.

Dai U.S. Pat. No. 5,882,996 discloses a method for patterning dual damascene interconnections using a developer soluble ARC interstitial layer.

In spite of known techniques for forming contacts and interconnects, increases in device density and demands for increased processing efficiency have spurred new efforts to effectively produce semiconductor interconnections.

SUMMARY OF THE INVENTION

The present invention provides a dual damascene structure in which a conventional etch stop layer (e.g., of silicon nitride) is replaced with an etch stop layer of either doped or undoped silicon oxide. If the etch stop layer is doped silicon oxide, then the dielectric layers above and below the etch stop layer are undoped silicon oxide. If the etch stop layer is undoped silicon oxide, then the dielectric layers above and below the etch stop layer are doped silicon oxide. An etch chemistry containing $C_2H_2F_4$ (and optionally $CHF_3$) provides sufficient etch selectivity between undoped silicon oxide and various doped oxides for the undoped silicon oxide to act as an etch stop layer (or vice versa). The use of undoped silicon oxide can lead to a significant reduction in the total dielectric constant of dual damascene structures relative to otherwise identical dual damascene structures including a silicon nitride layer.

DESCRIPTION OF THE PREFERRED EMBODIMENTS

A dual damascene interconnect structure according to the invention includes a contact dielectric layer, an etch stop layer of undoped silicon oxide on the contact dielectric layer, a trench layer on the etch stop layer, and a continuous electrically conductive interconnect passing through holes in the contact dielectric layer, the etch stop layer and the trench layer. The term "undoped" as used herein refers to a dopant concentration of less than 1.0 wt. %. Conversely, the term "doped" as used herein refers to a dopant concentration of greater than or equal to 1.0 wt. %.

Figure 1:
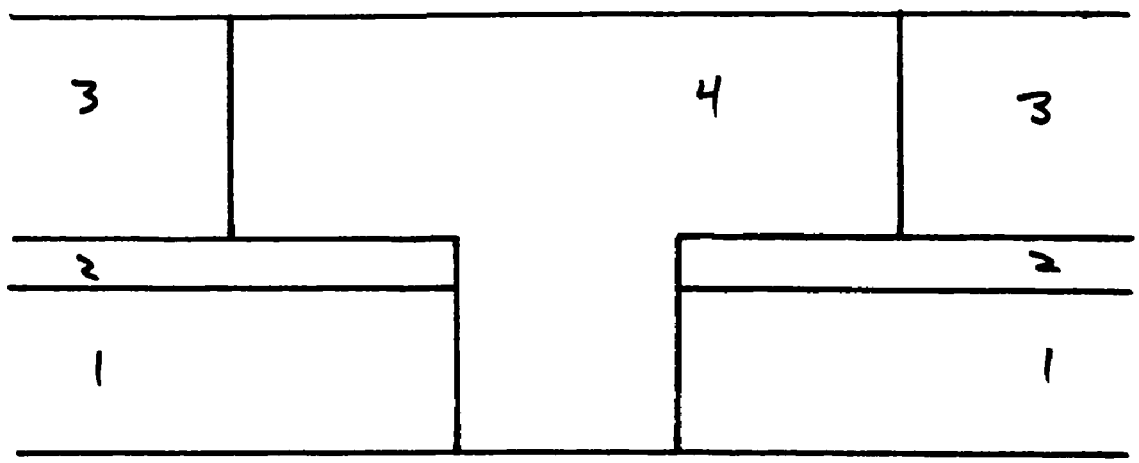
FIG. 1 shows a dual damascene interconnect structure including an etch stop layer of undoped silicon oxide.

FIG. 1 shows an embodiment of the interconnect structure according to the invention. In this embodiment contact dielectric layer 1 includes a hole passing through contact layer 1. Etch stop layer 2 is in direct contact with contact dielectric layer 1 and includes a hole passing through etch stop layer 2. The hole in etch stop layer 2 overlaps and aligns with the hole in contact dielectric layer 1, forming a hole passing through etch stop layer 2 and contact dielectric layer 1. Trench layer 3 is in direct contact with etch stop layer 2 and includes a trench passing through trench layer 3. The trench in trench dielectric layer 3 is wider than and overlaps the hole passing through etch stop layer 2 and contact dielectric layer 1. In other embodiments, the trench in trench dielectric layer 3 can be the same width as or smaller than the hole passing through etch stop layer 2 and contact dielectric layer 1. Continuous electrically conductive interconnect 4 is inside, and preferably fills, the trench in trench dielectric layer 3 and the hole passing through etch stop layer 2 and contact dielectric layer 1.

Contact dielectric layer 1 and trench dielectric layer 3 can each include a single dielectric material or multiple layers of the same or different dielectric materials. The dielectric material in the contact dielectric layer and the trench dielectric layer can be doped or undoped, provided that the dielectric material can be etched, in particular, chemically etched. Preferably, the dielectric material is a doped oxide including silicon. The doping can be provided by any conventional dielectric material dopant, including, for example, B, Al, Ga, In, C, Si, Ge, Sn, N, P, As, Sb, and F. The doped oxide can be doped $SiO_x$, where $0<x\leq2$, preferably $1<x\leq2$, more preferably $1.5<x\leq2$. Preferably, the doped oxide is a doped silicate glass, such as, for example, fluorosilicate glass (FSG), borosilicate glass (BSG), phosphosilicate glass (PSG) and/or borophosphosilicate glass (BPSG). The thickness of each of the contact dielectric layer and the trench dielectric layer is not particularly limited. Preferably, the thickness of the contact dielectric layer is within the range of about 0.1 to 3.0 µm, more preferably 0.2 to 2.0 µm, even more preferably 0.3 to 1.0 µm. Preferably the thickness of the trench dielectric layer is within the range of about 0.1 to 3.0 µm, more preferably 0.15 to 1.5 µm, even more preferably 0.2 to 1.0 µm. For 0.18 µm gate width technology, a typical value for the contact dielectric layer thickness may be about 0.6 µm, and a typical value for the trench dielectric layer thickness may be about 0.3 µm.

Etch stop layer 2 may contain undoped silicon oxide, such as undoped $SiO_x$, where $0<x\leq2$, preferably $1<x\leq2$, more preferably $1.5\leq x\leq2$. Etch stop layer 2 has a substantially lower rate of etching in a chemistry containing $C_2H_2F_4$ (and optionally $CHF_3$) than trench dielectric layer 3 and contact dielectric layer 1.

$C_2H_2F_4$ etch chemistry, for etching trench and contact dielectric layers, may further include one or more etchants of the formula $C_xH_yF_z$, where $x=1–6$, preferably $1–4$; $y=0–2x$, preferably $0–x$, more preferably 1 or 2; and $z=(2x-2-y)$, $(2x-y)$ or $(2x+2-y)$; preferably a first etchant of the formula $C_aH_bF_c$, where $a=1$ or 2, preferably 1; $b=0–2$, preferably 1 or 2, more preferably 1; and $c=(2a+2-b)$; and/or a second etchant of the formula c-$C_pH_qF_r$, where "c-" means a cyclic ring of carbon atoms, preferably a cyclic ring of 3 or 4 carbon atoms; $p=3–6$, preferably 3 or 4; $q=0–4$, preferably $0–2$, more preferably 0; and $r=(2p-2-q)$ or $(2-q)$, preferably $(2p-q)$. In specific embodiments, the first etchant may be selected from the group consisting of $CHF_3$, $CF_4$, $C_2F_6$, and combinations thereof, and is preferably $CHF_3$; and the second (optional) etchant may be c-$C_4F_8$.

In an embodiment, for example, a flow rate for $C_2H_2F_4$ may be approximately 2 sccm to 100 sccm, and preferably may be approximately 4 sccm to 40 sccm, and more preferably 6 sccm to 20 sccm. A flow rate for $CHF_3$ may be approximately 0 sccm to 200 sccm, and preferably may be approximately 10 sccm to 150 sccm, and more preferably 30 sccm to 100 sccm. A flow rate for $C_4F_8$ may be approximately 0 sccm to 100 sccm, and preferably may be approximately 2 sccm to 40 sccm, and more preferably 4 sccm to 20 sccm. A flow rate for Ar may be approximately 10 sccm to 300 sccm, and preferably may be approximately 20 sccm to 250 sccm, and more preferably 30 sccm to 200 sccm. A process pressure for such selective etch process may be approximately 10 mTorr to 200 mTorr, and preferably may be approximately 20 mTorr to 150 mTorr, and more preferably 30 mTorr to 100 mTorr. A magnetic filed supplied to the process chamber during the etch process may be approximately 0 G to 100 G, and preferably may be approximately 10 G to 70 G, and more preferably 20 G to 40 G. An RF power for the process may be approximately 200 W to 2000 W, and preferably may be approximately 300 W to 1500 W, and more preferably 400 W to 1000 W. A He cooling pressure for the wafer temperature control may be approximately 2 Torr to 60 Torr, and preferably may be approximately 4 Torr to 40 Torr, and more preferably 6 Torr to 20 Torr.

In accordance with the present invention, during the etching process using the $C_2H_2F_4$ chemistry the etch rate ratio of the etch stop layer material to either the contact dielectric layer material or the trench dielectric layer material is independently $\leq 1/8$, preferably $\leq 1/12$, more preferably $\leq 1/15$. The etch stop layer typically will have a thickness of from about 100 to about 1,000 Å, preferably from about 200 to about 800 Å, more preferably from about 300 to about 700 Å.

Interconnect 4 can be any electrically conductive material. Preferably the interconnect is a metal or a metal alloy. Suitably metals include Al, Cu, W and Ti. Suitable metal alloys include Al—Cu, Al—Si—Cu, Al—Ge and Al—Si—Ge.

Figure 2:
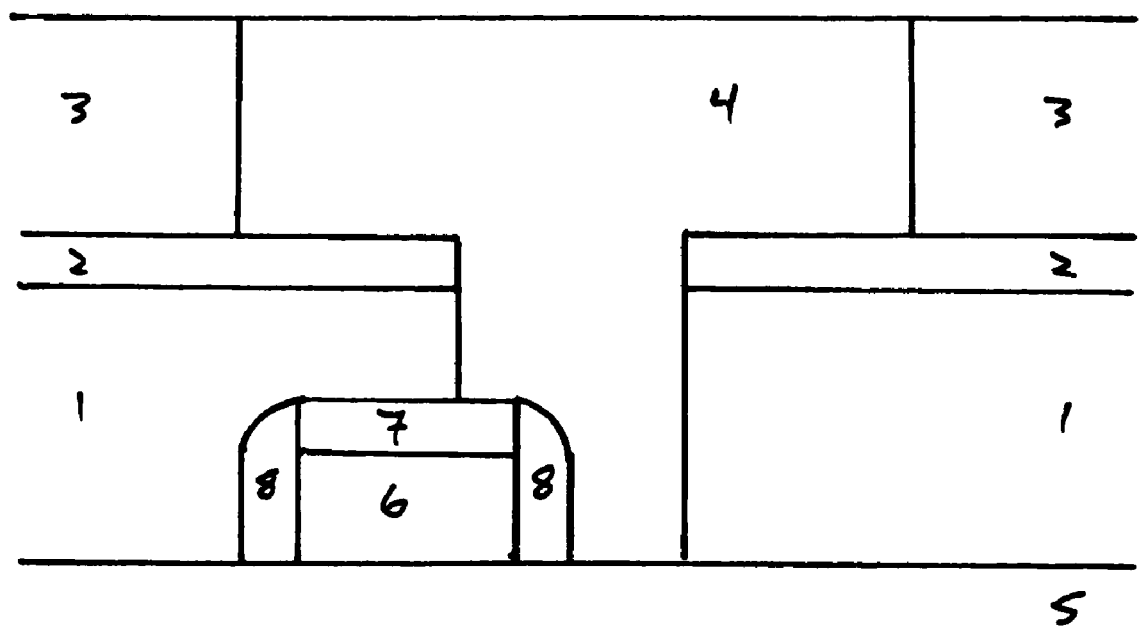
FIG. 2 shows a dual damascene interconnect structure, including an etch stop layer of undoped silicon oxide, formed on a substrate with a gate.

FIG. 2 shows an embodiment in which the interconnect structure of the present invention is formed on a gated substrate structure including an electrically conductive gate 6 on a substrate 5. The substrate 5 can include (not shown) electrically active semiconductor devices (each including, e.g., a source, a gated channel and a drain), metal lines and various dielectric regions. Although any semiconductor can be used, the active devices are preferably based on silicon. Gate 6 can have dielectric cap 7, and dielectric spacer 8, which separate gate 6 from contact dielectric layer 1 and electrically insulate gate 6 from conductive interconnect 4. Suitable caps and spacers may be formed by conventional methods known to those of ordinary skill in the art. For example, spacers can be formed by depositing a dielectric spacer material by LPCVD or PECVD, followed by anisotropically etching the deposited dielectric spacer material to form the spacer. A suitable dielectric spacer material may be selected by those of ordinary skill in the art and may provide a lower rate of etching relative to the surrounding contact dielectric material, thus protecting the gate 6 during processing. For example, one suitable spacer material comprises a nitride such as silicon nitride (e.g. when the contact dielectric comprises an oxide). Typically, cap 7 will be about 100 Å to about 3,500 Å thick, preferably about 500 Å to about 2000 Å thick. Typically, spacer 8 will have a width, measured at the base, of from about 100 to about 1,500 Å, generally about 500 Å to 800 Å.

Between the interconnect 4 and the gated substrate an optional adhesion layer (not shown) can be used to promote the adhesion of interconnect 4 to the gated substrate. Suitable materials for adhesion layers are known in the art, and include, for example, Ti, Zr, Hf, Ta, Cr, Mo, W, Cu, Ni, Co, Ru, Rh, Pd, Os, Ir, Pt, Au, Ag, and alloys and (conductive) nitrides thereof. Interconnect 4 is preferably connected to an active device region in the substrate, either directly or through metal lines in the substrate 5.

The use of undoped silicon oxide (e.g., as an etch stop layer) can lead to a reduction in total dielectric constant in dual damascene structures. In conventional dual damascene structures, a silicon nitride etch stop layer is sandwiched between layers of silicon oxide. The silicon nitride increases the effective dielectric constant of the dual damascene structures. Replacing the silicon nitride with undoped silicon oxide eliminates a source of increased dielectric constant in dual damascene structures and can lead to a 10–40% reduction in total dielectric constant relative to an otherwise identical dual damascene structure having a silicon nitride etch stop layer.

FIGS. 3A–3D illustrate a process for making a dual damascene interconnect structure according to the invention with an etch stop layer of undoped silicon oxide, which resists etching by the $C_2H_2F_4$ chemistry. According to this embodiment, a gated substrate with a electrically conductive gate 6 on a substrate 5 is first provided by using conventional methods known to those of ordinary skill in the art. The gate 6 is covered with cap 7 and spacer 8 of one or more dielectric materials chosen so that the gate 6 is protected during subsequent processing.

Contact dielectric layer 1 is deposited on the gated substrate and planarized using a conventional film deposition and planarization techniques. Film deposition techniques, such as chemical vapor deposition or plasma-assisted vapor deposition, and planarization techniques, such as chemical-mechanical polishing, isotropic etching, and reflow techniques, are known in the art.

Figure 3A:
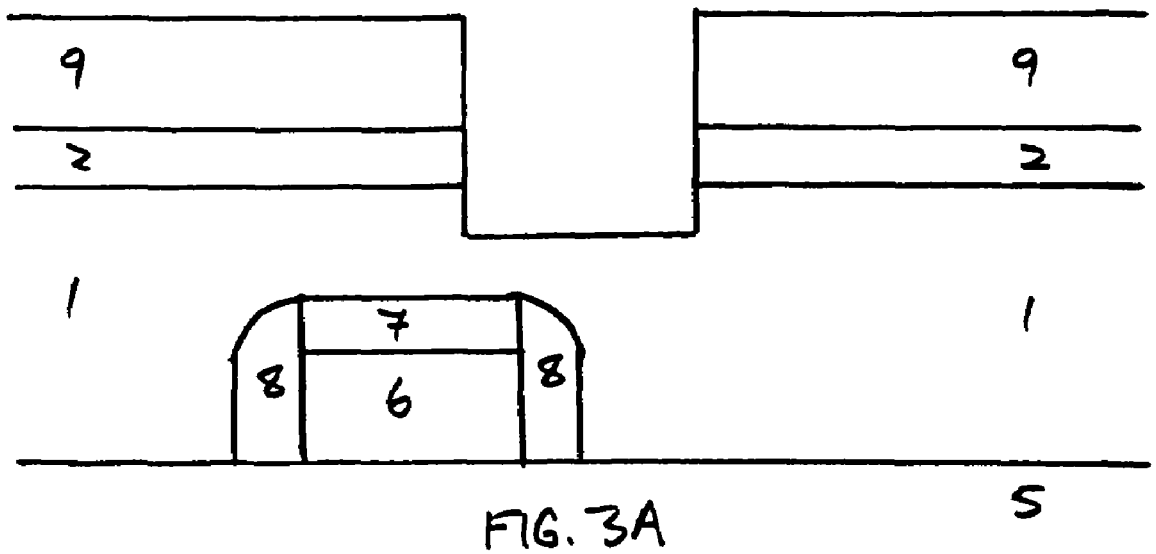
FIGS. 3A–3D show a method of forming a dual damascene interconnect structure that includes an etch stop layer of undoped silicon oxide.

Etch stop layer 2 is then deposited on contact dielectric layer 2, and resist layer 9 is deposited on etch stop layer 2. Resist layer 9 is exposed and developed to form a hole in resist layer 9 exposing the underlying etch stop layer 2. Lithographic patterning techniques using resists are well known in the art. Typically photoresists, both positive and negative, are used. As shown in FIG. 3A, the exposed portion of etch stop layer 2 is then etched using reactive ion etching and a conventional oxide etching gas chemistry, which is well known in the art, to form a via hole through etch stop layer 2 and into the underlying contact dielectric layer 1. Such chemistries may include reactive ion etching with an etchant of the formula $C_xF_y$ (where x=1–6, preferably 1–4, more preferably 1–2, and y=(2x−2), 2x or (2x+2), but is at least 4), $C_aH_bF_c$ (as defined above), $SF_6$, $NF_3$, $Cl_2$, HF, HCl, and/or $CCl_4$. In one embodiment, the etch stop layer is etched using a chemistry comprising $CHF_3$, $CF_4$, and/or $C_2F_6$, preferably a mixture of $CHF_3$ and either $CF_4$ or $C_2F_6$, optionally in the presence of Ar. Resist layer 9 is removed from etch stop layer 9 using conventional means known in the art.

Figure 3B:
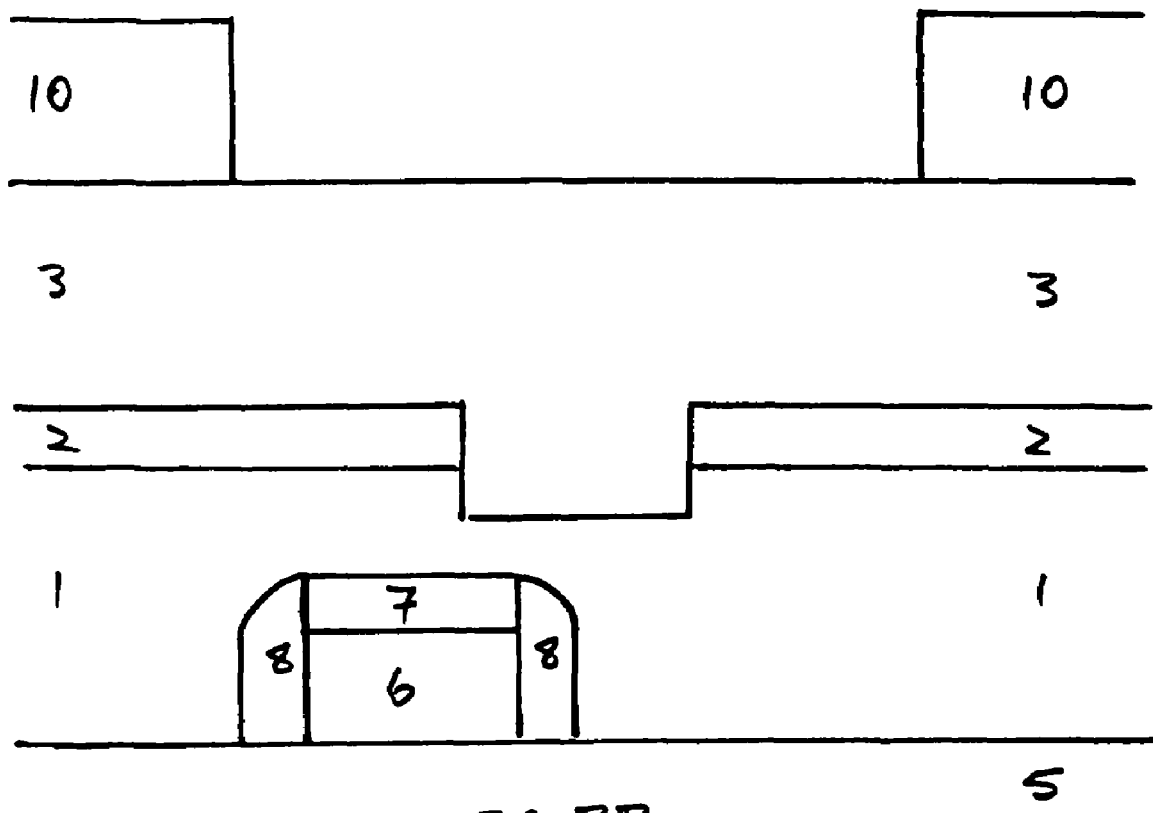
Figure 3C:
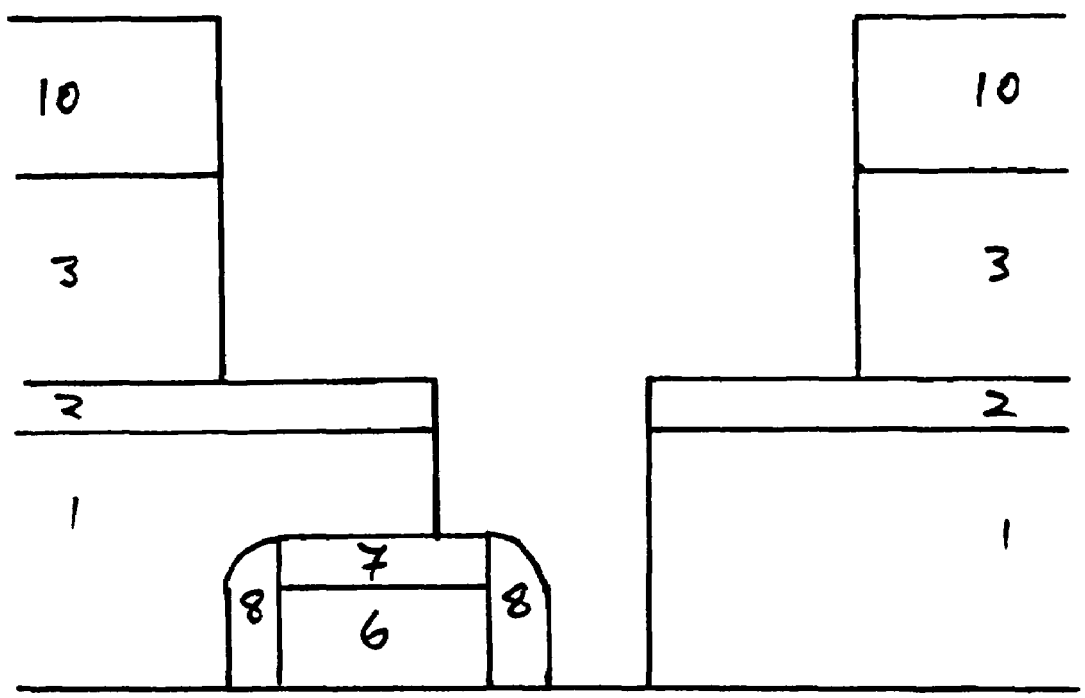

Trench dielectric layer 3 is then deposited on etch stop layer 2 and planarized using conventional film deposition and planarization techniques. As shown in FIG. 3B, resist layer 10 is then deposited on trench dielectric layer 3 and patterned using conventional lithographic techniques to uncover portions of trench dielectric layer 3. As shown in FIG. 3C, the exposed portions of trench dielectric layer 3 are then etched by reactive ion etching using the above-described $C_2H_2F_4$ (and optional $CHF_3$) chemistry. Because the undoped silicon oxide of etch stop layer 2 resists etching by the $C_2H_2F_4$ chemistry, only the trench dielectric layer material in, and the contract dielectric layer material below, the via hole in etch stop layer 2 is etched, preferably sufficiently to expose the substrate.

Figure 3D:
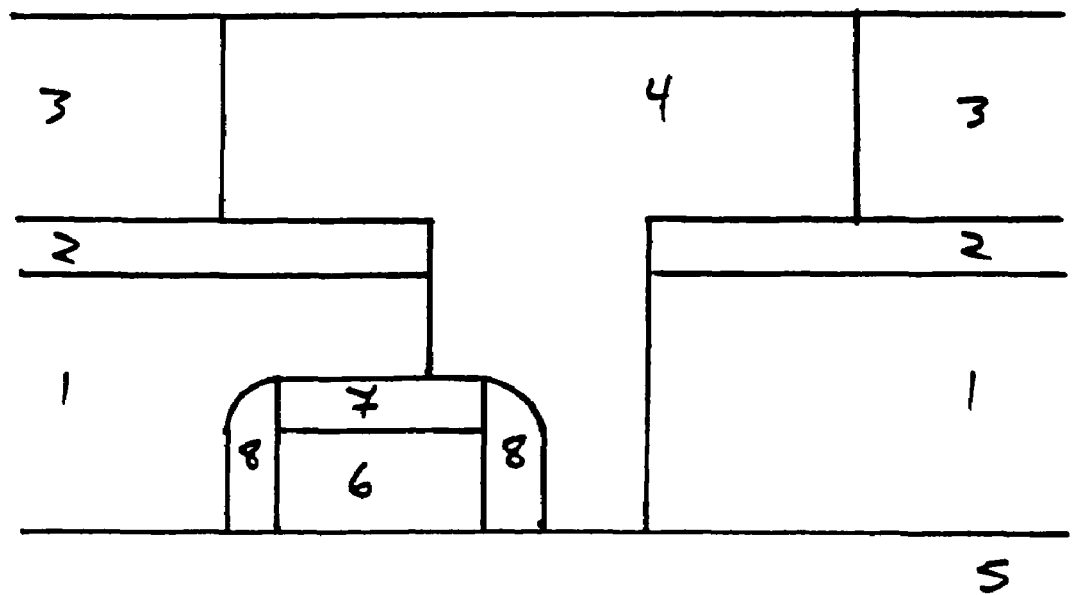

As shown in FIG. 3D, interconnect 4 is then formed by depositing a metal into the holes in the trench dielectric layer 3, etch stop layer 2 and contact dielectric layer 1, preferably filling the holes. The deposited metal is then planarized using conventional planarization techniques.

The process shown in FIGS. 3A–3D represents only one of many methods of making the interconnect structure according to the present invention. Other methods are adaptations of conventional dual damascene processes, within the skill in the art, in which conventional silicon nitride etch stop layers and associated etch chemistry are replaced with the undoped silicon oxide etch stop layer and $C_2H_2F_4$ etch chemistry of the present invention (see, e.g., U.S. Ser. No. 09/593,968, filed Jun. 15, 2000, the relevant portions of which are incorporated herein by reference). Depending upon the particular dual damascene process adapted, the contact dielectric layer material and/or the trench dielectric layer material can be doped or undoped. In embodiments, the trench dielectric layer can be etched by $C_2H_2F_4$, which stops at the undoped silicon oxide of the etch stop layer. In other embodiments, such as is shown in FIGS. 3A–3D, the trench dielectric layer can be etched with a gas chemistry, such as a chemistry containing $CF_4$ and/or $C_2F_6$, that also etches the undoped silicon oxide etch stop layer. In these embodiments, subsequent etching with $C_2H_2F_4$ can transfer the hole in the etch stop layer through the contact dielectric layer to the substrate without widening the hole in the etch stop layer.

In embodiments of the present invention, the trench dielectric layer, the etch stop layer and the contact dielectric layer are etched using a chemical etching technique, preferably reactive ion etching. Determination of process parameters for reactive ion etching is within the skill in the art. Etching gases useful in reactive ion etching include halocarbons such as $CHF_3$, $C_4F_8$, $C_2F_6$, F-134 (1,1,1,2-tetrafluoroethane), F-134a, $CF_4$, $SF_6NF_3$ $Cl_2$, HF, HCl, $CCl_4$, and mixtures thereof. The total flow rate of etching gas, including argon and/or carrier gases, is typically 5 to 500 SCCM, more preferably 15 to 300 SCCM and even more preferably 25 to 250 SCCM. Of this flow, up to 450 SCCM, preferably from 4 to 200 SCCM, may comprise a carrier gas such as Ne, Kr, Xe, CO, $CO_2$, $SO_2$, He, $O_2$, $N_2$ and mixtures thereof.

In embodiments of the invention, a dual damascene process may include a step in which only a portion of the trench dielectric layer 3, the etch stop layer 2 or the contact dielectric layer 1 is etched. Under the etch conditions selected, an etching rate may be determined, and etching under the selected set of conditions may be conducted for a time sufficient to substantially remove the trench dielectric layer 3, the etch stop layer 2 or the contact dielectric layer 1 to a predetermined depth. The determination of the conditions and time(s) that provide such an etch is within the level of skill of those of ordinary skill in the art, and will typically take into consideration the thickness and composition of the trench dielectric layer 3, the etch stop layer 2 or the contact dielectric layer 1, along with the parameters of the plasma. For example, a suitable etchant gas for etching a phosphorous-doped silicon dioxide trench dielectric layer 3 may comprise a mixture of $C_2H_2F_4$, $CHF_3$, $C_4F_8$ and $CF_4$, and etching for about one minute under conditions providing an etch rate of approximately 3,000 Å per minute will remove about half of a 6,000 Å thick trench dielectric layer. In a further example, etching a phosphosilicate glass (PSG) dielectric layer with an etchant comprising F-134, $C_4F_8$, and $CHF_3$ (Ar optional) at a total pressure of 10–300 mTorr (preferably about 55 mTorr), a magnetic field of 10–50 gauss (preferably about 30 gauss), and at a power of 100–2,500 W (preferably from about 500 to about 1,500 W) for a length of time of about 3 minutes, may be sufficient to remove from 8,000 to 9,000 Å of the dielectric layer at a rate of about 3,000 Å/min.

Semiconductor processing conditions that can be used in dual damascene processes are disclosed in U.S. application Ser. Nos. 08/577,751; 08/683,407; 08/693,978; 08/935,705; 09/253,991; and 09/326,432, and in U.S. Pat. Nos. 5,468,342 and 5,562,801, the relevant portions of which are incorporated by reference herein.

While the present invention has been described with respect to specific embodiments, it is not confined to the specific details set forth, but includes various changes and modifications that may suggest themselves to those skilled in the art, all falling within the scope of the invention as defined by the following claims.

What is claimed is:

1. A method comprising selectively etching a trench dielectric layer and a contact dielectric layer in a structure comprising the trench dielectric layer, the contact dielectric layer, and an etch stop layer therebetween comprising undoped silicon oxide and having a hole therein, the hole containing a trench dielectric layer material, with an etch gas including $C_2H_2F_4$.

2. A method of forming an interconnect structure, the method comprising
   depositing an etch stop layer, containing an undoped silicon oxide, on a contact dielectric layer containing a first oxide comprising silicon;
   forming a hole through the etch stop layer;
   depositing a trench dielectric layer, containing a second oxide comprising silicon, on the etch stop layer and in the hole through the etch stop layer;
   forming a trench in the trench dielectric layer and a hole through the contact dielectric layer by etching the first and second oxides; and
   depositing an electrically conductive interconnect in the trench, the hole through the etch stop layer and the hole through the contact dielectric layer, wherein
   forming the trench comprises etching the second oxide with a chemistry containing $C_2H_2F_4$.

3. The method according to claim 2, wherein forming the hole through the etch stop layer comprises etching with a chemistry containing at least one of $C_xF_y$ (where x=1–6, and y=(2x−2), 2x or (2x+2), but is at least 4) and $C_aH_bF_c$ (where a=1 or 2, b=0–2, and c=(2a+2−b)).

4. The method according to claim 1, wherein the method further comprises partially etching the contact dielectric layer before the trench dielectric layer is etched.

* * * * *